(12) United States Patent
Shields

(10) Patent No.: US 11,291,150 B2
(45) Date of Patent: Mar. 29, 2022

(54) MAGNETIC CIRCUIT AND METHOD FOR USE

(71) Applicant: Robert Carl Shields, Louisville, KY (US)

(72) Inventor: Robert Carl Shields, Louisville, KY (US)

(*) Notice: Subject to any disclaimer, the term of this patent is extended or adjusted under 35 U.S.C. 154(b) by 96 days.

(21) Appl. No.: 16/904,078

(22) Filed: Jun. 17, 2020

(65) Prior Publication Data

US 2020/0323113 A1    Oct. 8, 2020

Related U.S. Application Data

(63) Continuation-in-part of application No. 15/723,847, filed on Oct. 3, 2017, now Pat. No. 10,721,850.

(51) Int. Cl.
| | | |
|---|---|---|
| *H05K 13/08* | (2006.01) | |
| *G01R 1/04* | (2006.01) | |
| *G01R 31/54* | (2020.01) | |
| *H01F 7/02* | (2006.01) | |
| *H01R 13/62* | (2006.01) | |
| *H01R 13/627* | (2006.01) | |

(52) U.S. Cl.
CPC ........... *H05K 13/08* (2013.01); *G01R 1/0408* (2013.01); *G01R 31/54* (2020.01); *H01F 7/0205* (2013.01); *H01R 13/6205* (2013.01); *H01R 13/6277* (2013.01); *Y10T 29/53022* (2015.01)

(58) Field of Classification Search
CPC ..... H05K 13/08; H01F 7/0205; H01F 7/0221; H01R 2201/20; Y10T 29/49764; Y10T 29/49778; Y10T 29/4978; Y10T 29/53022; Y10T 29/532; Y10T 29/536; G01R 1/0408; G01R 1/0416; G01R 1/16; G01R 1/30; G01R 31/01; G01R 31/013; G01R 31/50; G01R 31/54; G01R 31/66
See application file for complete search history.

(56) References Cited

U.S. PATENT DOCUMENTS

| | | |
|---|---|---|
| 6,283,800 B2 | 9/2001 | Sasaki et al. |
| 8,763,228 B2 | 7/2014 | Le Vacon |
| 8,816,696 B2 | 8/2014 | Kogasumi |
| 10,078,106 B2 | 9/2018 | Taylor |
| 2014/0132103 A1 | 5/2014 | Gomyo et al. |

*Primary Examiner* — Peter Dungba Vo
*Assistant Examiner* — Joshua D Anderson
(74) *Attorney, Agent, or Firm* — Middleton Reutlinger

(57) ABSTRACT

An apparatus and method for determining whether a conductive ring is attached to an electrically conductive shaft. The body of the apparatus includes an electrical contact and at least one magnet in a magnet recess. The at least one magnet may include a first and second conductive region, where the first conductive region is a fixed, first radial distance from a center point of the inner cavity and the second conductive region is a second radial distance from the center point of the inner cavity. A shaft recess of the conductive shaft aligns with the magnet recess when the conductive shaft is inserted into the inner cavity and an electric circuit detects whether a metal ring is secured around the conductive shaft in response to simultaneous contact between: the metal ring and the at least one magnet and the conductive shaft and the electrical contact.

18 Claims, 7 Drawing Sheets

MAGNETIC CIRCUIT AND METHOD FOR USE

CROSS REFERENCE TO RELATED APPLICATION

The present application is a continuation-in-part of U.S. patent application Ser. No. 15/723,847, filed on Oct. 3, 2017, the disclosure of which is hereby incorporated herein by reference.

BACKGROUND

In the manufacture of machine parts and assembly of complex machinery, such as automotive parts and assembly, an operator is often required to perform a repetitive act for long periods of time. For example, an operator may be required to identify that two parts have been properly assembled and further, may be required to do so with only visual inspection. Such inspection is prone to error because an operator may become fatigued or distracted. Further, to prevent errors, inspection of smaller parts may need to be performed at a slower speed than optimal for assembly to allow the operator to properly inspect each piece.

Particularly, in the manufacture of some components, such as shafts that are part of a transmission and/or other driveshaft assemblies, a ring may be placed on the shaft in a circumferential recess on the shaft. The metal ring allows for the shaft to be securely inserted into another component because the metal ring may be nested in the recess during insertion and/or the insertion point may be beveled. Once the shaft is in place, the ring may freely move partially out of the recess and, for instance, into a recess of the component, thus securing the shaft and component together.

However, as each shaft/ring component is assembled, it is important to ensure that the ring has in fact been placed on the shaft. Visual inspection of each shaft/ring component ensures that the ring is present. By performing the same task repeatedly, the assembly line worker may become careless, fatigued, etc. due to the monotony of the task. For example, the task may be related to reviewing schematics to properly assemble elements of the manufacturing process. As another example, the task may be related to quality control to ensure the elements of the manufacturing process are assembled properly. Despite quality control procedures, carelessness, fatigue, etc. may still result in human error along the moving assembly line, which may cause an assembled object, specifically an automobile, to be defective. These defects may cause hazardous working conditions for assembly line workers. Further, these defects may result in hazardous operating conditions for an end-user of the automobile.

Thus, there is a need in the art for removing the potential for human error causing hazardous defects along the moving assembly line.

SUMMARY

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

In one aspect, an apparatus is provided and includes: a body with an open end and an at least partially cylindrical inner cavity defined by an inner surface having an inner side surface and an inner end surface opposite the open end, where an at least partially electrically conductive shaft is receivable by the inner cavity; an electrical contact located on the inner surface such that the conductive shaft is in contact with the electrical contact when the conductive shaft is inserted into the inner cavity; at least one magnet located in a magnet recess in the inner side surface of the body, where the at least one magnet further includes a first conductive region and a second conductive region; where the first conductive region is a fixed, first radial distance from a center point of the inner cavity and the second conductive region is a second radial distance from the center point of the inner cavity; where a shaft recess of the conductive shaft aligns with the magnet recess in the inner side surface when the conductive shaft is inserted into the inner cavity; and an electric circuit that detects whether a metal ring is secured around the conductive shaft at the shaft recess of the conductive shaft in response to simultaneous contact between: the metal ring and the at least one magnet; and the conductive shaft and the electrical contact.

In some embodiments, the first conductive region is a first side magnet and the second conductive region is a second side magnet. In some such embodiments, the electric circuit further provides a first signal if the metal ring is detected through simultaneous contact between: the metal ring and the first side magnet, and the conductive shaft and the electrical contact; where the first signal indicates the metal ring meets a minimum size requirement. In other such embodiments, the electric circuit further provides a second signal if the metal ring is detected through simultaneous contact between: the metal ring and the second side magnet, and the conductive shaft and the electrical contact; where the second signal indicates the metal ring exceeds a maximum size requirement.

In other embodiments, the first conductive region is a first side magnet and the second conductive region is a conductive movable rod located in the first side magnet and is configured to move between a retracted position and an extended position, where in the retracted position the conductive movable rod is substantially flush with or retracted into the first side magnet; and where in the extended position the conductive movable rod extends from the first side magnet. In some such embodiments, the electric circuit further provides a first signal if the metal ring is detected through simultaneous contact between: the metal ring and the conductive movable rod in the extended position, and the conductive shaft and the electrical contact; where the first signal indicates the metal ring meets a minimum size requirement. In other such embodiments, the electric circuit further provides a second signal if the metal ring is detected through simultaneous contact between: the metal ring and the conductive movable rods in the retracted position, and the conductive shaft and the electrical contact; where, the second signal indicates the metal ring is improperly attached to the conductive shaft.

In some embodiments, the electric circuit further provides a signal if the metal ring is not detected.

In another aspect, an apparatus is provided and includes: a body having an open end and an at least partially cylindrical inner cavity defined by an inner surface having an inner side surface and an inner end surface opposite the open end, wherein the inner cavity is to receive an at least partially electrically conductive shaft; an electrical contact positioned on the inner surface to contact the conductive shaft when the conductive shaft is inserted into the inner cavity; one or more first side magnets and one or more second side magnets, each of which are located in a magnet recess in the inner side surface of the body; where the one or more first side magnets are disposed in the magnet recess at a first radial distance from a center point of the inner cavity and the one or more second side magnets are disposed in the magnet recess at a second radial distance from the center point of the inner cavity; where a shaft recess of the conductive shaft aligns with the magnet recess in the inner side surface when the conductive shaft is inserted into the inner cavity; and an electric circuit that detects whether a metal ring is secured around the conductive shaft at the shaft recess of the conductive shaft in response to simultaneous contact between: the metal ring and the one or more first side magnets or the one or more second side magnets; and the conductive shaft and the electrical contact.

In some embodiments, the electric circuit further provides a first signal if the metal ring is detected through simultaneous contact between the metal ring the one or more first side magnets and the conductive shaft and the electrical contact, where the first signal indicates the metal ring meets a minimum size requirement. In other embodiments, the electric circuit further provides a second signal if the metal ring is detected through simultaneous contact between the metal ring and the one or more second side magnets and the conductive shaft and the electrical contact, where the second signal indicates the metal ring exceeds a maximum size requirement. In still other embodiments, the electric circuit further provides a signal if the metal ring is not detected.

In some embodiments, the electric circuit is nominally open, and the simultaneous contact closes the electric circuit.

In still another aspect, an apparatus is provided and includes: a body having an open end and an at least partially cylindrical inner cavity defined by an inner surface having an inner side surface and an inner end surface opposite the open end, where an at least partially electrically conductive shaft is receivable by the inner cavity; an electrical contact positioned on the inner surface such that the conductive shaft is in contact with the electrical contact when the conductive shaft is inserted into the inner cavity; at least one magnet disposed in a magnet recess in the inner side surface of the body, where the at least one magnet includes a conductive movable rod; where in a retracted position the conductive movable rod is substantially flush with or retracted into the at least one magnet; and where in an extended position the conductive movable rod extends into the inner cavity; an electric circuit that detects whether a metal ring is secured around the conductive shaft at the shaft recess of the conductive shaft in response to simultaneous contact between: the metal ring and at least portion of the at least one magnet; and the conductive shaft and the electrical contact.

In some embodiments, the electric circuit provides a first signal if the metal ring is detected through simultaneous contact between the metal ring and the conductive movable rod in the extended position and the conductive shaft and the electrical contact, where the first signal indicates the metal ring meets a minimum size requirement. In other embodiments, the electric circuit further provides a second signal if the metal ring is detected through simultaneous contact between the metal ring and the conductive movable rod in the retracted position and the conductive shaft and the electrical contact, where the second signal is indicative the metal ring is improperly attached to the conductive shaft. In still other embodiments, the electric circuit further provides a signal if the metal ring is not detected.

In some embodiments, the electric circuit is nominally open, and the simultaneous contact closes the electric circuit.

BRIEF DESCRIPTION OF THE DRAWINGS

In the drawings, like reference characters generally refer to the same parts throughout the different views. Also, the drawings are not necessarily to scale, emphasis instead being generally placed upon illustrating the principles of the embodiments depicted.

DETAILED DESCRIPTION

Figure 1:
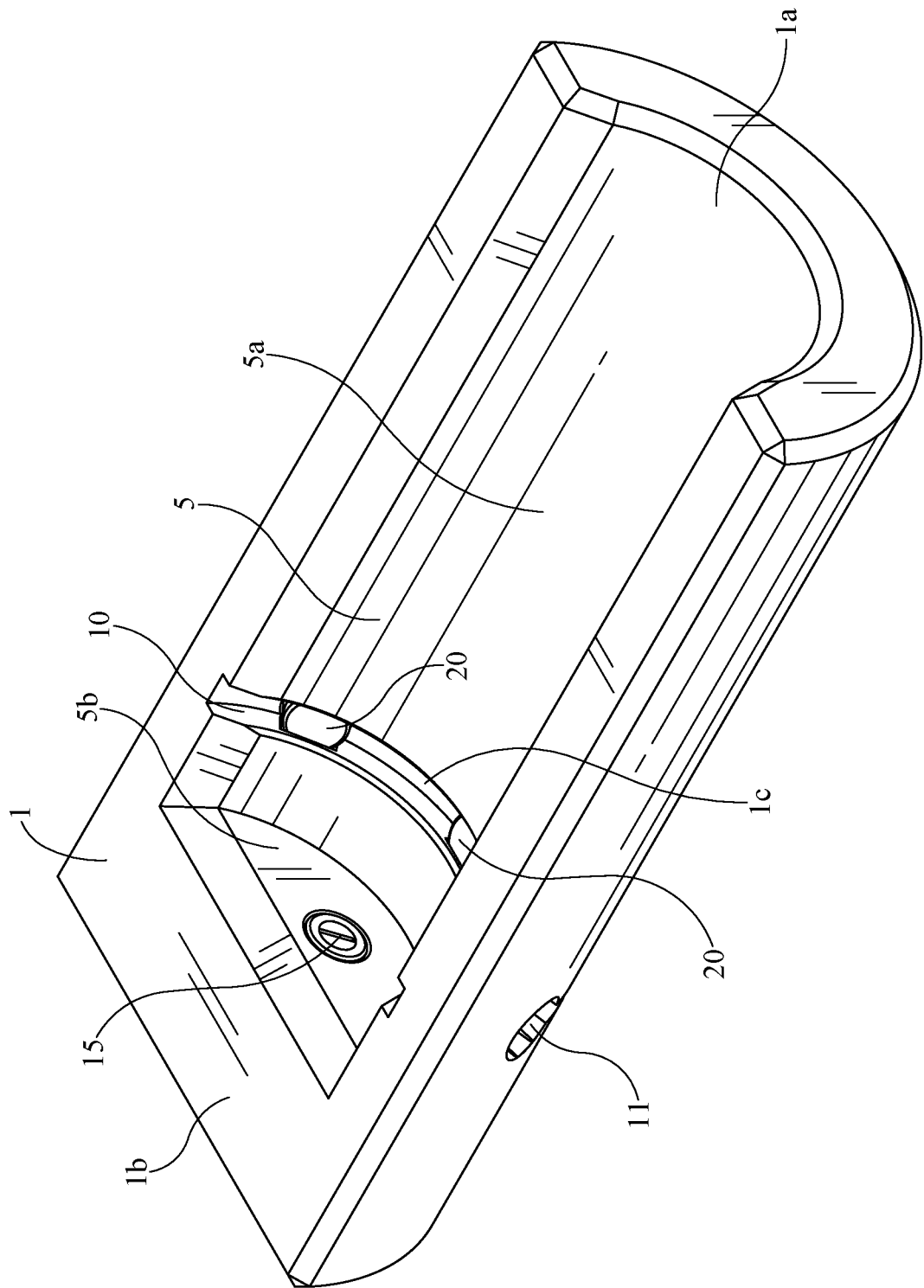
FIG. 1 is a perspective view of an embodiment of the present disclosure.

Referring to FIG. 1, a perspective view of an embodiment of the present disclosure is provided. The body 1 includes an open end 1a and a closed end 1b opposite the open end 1a and defines a partially cylindrical inner cavity 5. Specifically, inner cavity 5 is defined by an inner side surface 5a and an inner end surface 5b at the closed end 1b of the body 1. As illustrated, the inner cavity 5 is a half-cylinder; however, in some embodiments, inner cavity 5 may be completely cylindrical, whereby access to the inner cavity 5 is only via open end 1a. Further, although body 1 is illustrated as a half cylinder, body 1 may include any portion of a cylinder as an inner cavity. Additionally, the proportions of the inner cavity 5 (including the location of magnet recess 10, as described herein) are contingent on the size of the shaft that is being tested by the apparatus. Thus, any diameter, length, and/or location of magnet recess 10 is possible, depending on the dimensions of the tested shaft.

An electrical contact 15 is provided on the inner end surface 5b of the inner cavity 5. Electrical contact 15 is positioned such that an outward-facing surface of electrical contact 15 is substantially flush with the inner end surface 5b. In some embodiments, electrical contact 15 may be provided such the outward-facing surface of magnet 15 is substantially flush with inner side surface 5a (e.g., electrical contact 15 is provided on the inner side surface 5a between the inner end surface 5b and the magnet recess 10). In some embodiments, electrical contact 15 may protrude slightly from the inner end surface 5a. In some embodiments, electrical contact 15 may be replaced by a magnet, permanent or electromagnetic.

A magnet recess 10 is provided on the inner side surface 5a. The magnet recess 10 is positioned circumferentially around the cylindrical inner cavity 5 and parallel to the inner end surface 5b. In some embodiments, the magnet recess 10 may be wider or narrower than the magnet recess illustrated in FIG. 1. Further, the magnet recess 10 may be positioned closer to or farther away from inner end surface 5b. The dimensions and location of the magnet recess 10 is dependent on the dimensions of the conductive shaft that is received by the body 1, as described herein.

One or more side magnets 20 are positioned in the magnet recess 10. As illustrated, each of the side magnets 20 are positioned in openings 11 in the body 1 of the apparatus. As opposed to the electrical contact 15, which is positioned such that the outward-facing surface of the electrical contact 15 is either substantially flush with the surface of the cavity 5 or protrudes from the surface of inner cavity 5, the side magnets 20 are positioned such that the inner surfaces (i.e., the surface of each of the side magnets 20 that is exposed to the inner cavity 5) are inset from (or recessed from) the side inner surface 5a. As illustrated, the side magnets 20 protrude from the magnet recess inner surface 1c, but not so far as to protrude into the inner cavity 5 farther than the inner side surface 5a. In some embodiments, the side magnets 20 may be substantially flush with the magnet recess inner surface 1c. In some embodiments, one or more of the side magnets 20 may not be stationary and instead may be attached to the body 1 such that the side magnets 20 may have at least some freedom of movement within the magnet recess 10.

Electrical contact 15 and side magnets 20 may be connected to one or more electrical circuits. For example, wiring to an electrical circuit may connect to the side magnets 20 via openings 11 in the body 1. In some embodiments, the magnets may be electromagnetic elements, which may become magnetized when a current is supplied to the magnets. In some embodiments, electrical contact 15 and/or side magnets 20 may be permanent magnets.

Figure 2:
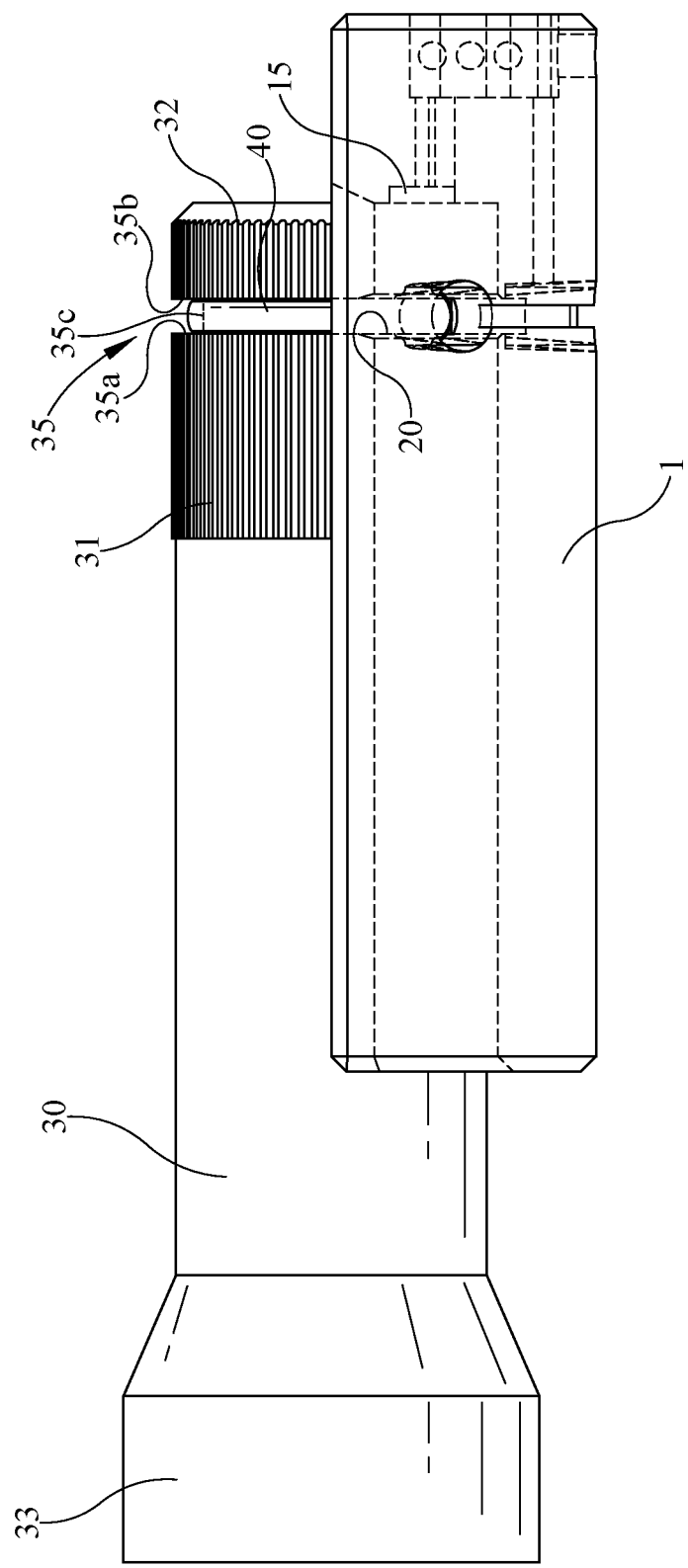
FIG. 2 is a side view of the embodiment of FIG. 1 with an electrically conductive shaft inserted into the body, in accordance with various embodiments.
Figure 3:
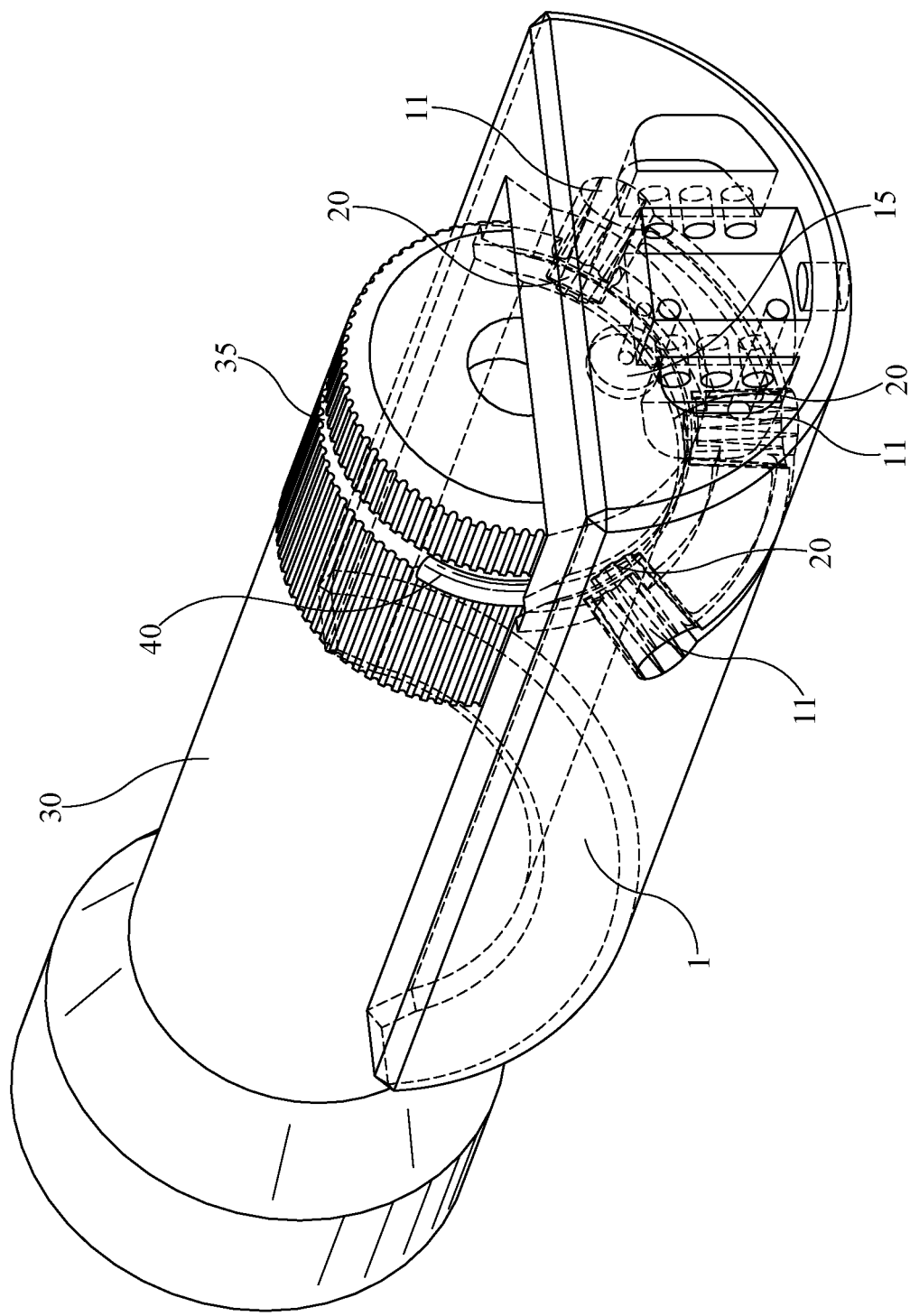
FIG. 3 is perspective view of the embodiment of FIGS. 1 and 2 with the electrically conductive shaft inserted.

Referring to FIGS. 2 and 3, a side view and perspective view of the body 1 of the apparatus with a conductive shaft 30 inserted into the body 1 are provided. The shaft 30 is at least partially electrically conductive and may be comprised of, for example, a metal or metal alloy. The shaft 30 includes a first end 32, which is received by the inner cavity 5 of the body 1. A second end 33 may extend more than illustrated in FIG. 2 and/or may include additional features that are not illustrated. An optional series of grooves 31 are provided on the outer surface of the shaft 30. The grooves 31 may be utilized by one or more other components, for instance, to grip the shaft 30 when the shaft 30 is inserted into one or more other components. For example, the shaft 30 may be inserted into one or more gear boxes of a transmission and the gears may grip the shaft 30 at the grooves 31 and rotate the shaft 30.

Shaft 30 includes a shaft recess 35 around the circumference of the shaft 30 and substantially parallel to the first end 32. The shaft recess 35 is defined by recess sides 35a, 35b and recess surface 35c. In some embodiments, recess sides 35a and 35b may be closer together or farther apart, depending on the application of the shaft 35. In some embodiments, shaft recess 35 may be closer to first end 32 and/or farther away from shaft end 35, depending on the application requirements for shaft 35.

A metal ring 40 is secured to the shaft 30 at the shaft recess 35. The metal ring 40 has a width slightly less than the distance between recess sides 35a and 35b and a diameter greater than the diameter of the shaft at recess inner surface 35c but less than the diameter of the shaft at an outer surface of shaft 30. Thus, once attached, the metal ring 40 is free to move and/or rotate within the shaft recess 35 while not becoming displaced from the shaft recess 35. As illustrated, metal ring 40 is not a closed shape and has a gap whereby the metal ring 40 was initially inserted onto the shaft 30 (i.e., metal ring 40 has a "C" shape). In some embodiments, metal ring 40 may be a closed shape (e.g., an oval or circular).

When shaft 30 is inserted into body 1, as illustrated in FIGS. 2 and 3, magnet recess 10 aligns with shaft recess 35. Thus, the side magnets 20 are not in direct contact with the shaft 30. Further, electrical contact 15 is in direct contact with the shaft 30. As illustrated, electrical contact 15 is in contact with first end 32. In some embodiments, electrical contact 15 may instead be in contact with a side of shaft 30.

Figure 4A:
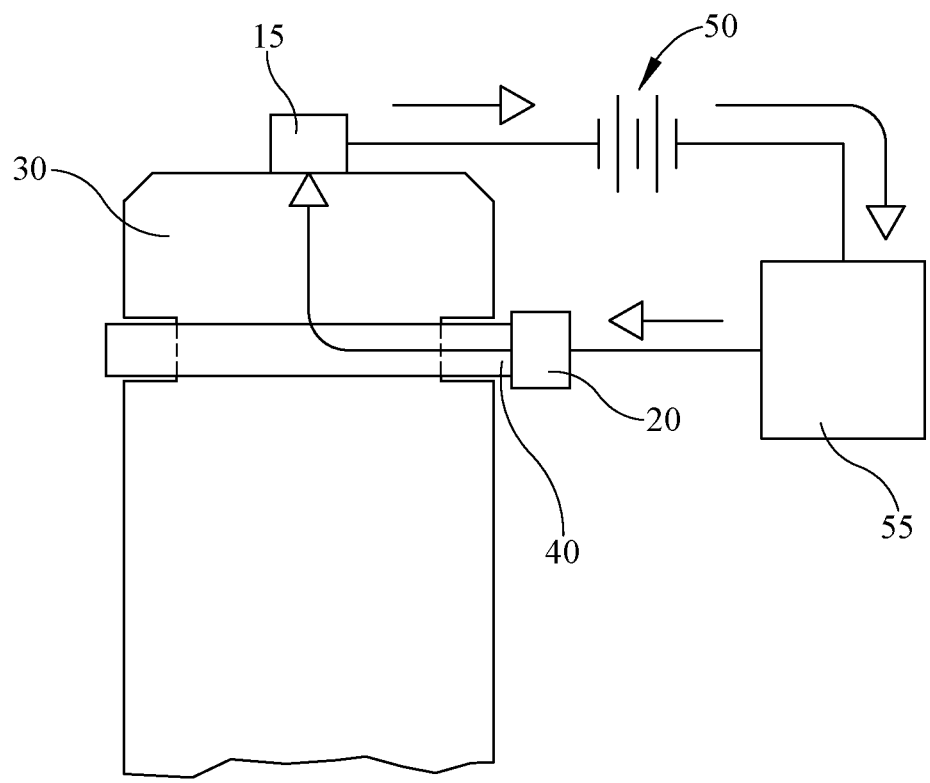
FIG. 4A is an electric circuit with the electrically conductive shaft and metal ring completing the circuit.

When the metal ring 40 is attached to the shaft 30, one or more of the side magnets 20 may be in contact with the metal ring 40. Thus, when inserted into the shaft recess 35, metal ring 40 is in contact with both the shaft (along the interior surface of the metal ring 40 for at least some portion) and one or more of the side magnets 20. Because both the metal ring 40 and the shaft 30 are electrically conductive, a generated current that is applied to apparatus with the electrical contact 15 as one terminal and the side magnets 20 as a second terminal would pass through the shaft 30 and metal ring 40. For example, as illustrated in FIG. 4A, metal ring 40 is in contact with one of the side magnets 20 and the electrical contact 15 is in contact with the metal shaft 30. Current generated by power source 50 flows from electrical contact 15, through shaft 30, through metal ring 40, through the side magnet 20, and to indicator 55 (as illustrated by the arrows).

As previously mentioned, in some embodiments, one or more of the side magnets 20 may not be stationary, as illustrated. Instead, body 1 may include one or more floating magnets that laterally move within the magnet recess 10. For example, magnet recess 10 may include a track whereby the side magnets 20 are permitted to move along the inner circumference of the magnet recess 10. Thus, the side magnets 20 may reposition until one or more come into contact with the metal ring 40. This embodiment is particularly useful in instances where the metal ring 40 is not loosely attached to the shaft 30 and the side magnets 20 would otherwise be unable to come into contact with the metal ring 40 even if the metal ring 40 is present. For example, the metal ring 40 may not freely move around the shaft 30 and further may not be a complete, closed shape. The side magnets 20 may move within the recess to detect the metal ring 40. If this were not the case, it is possible that all of the side magnets 20 could be located at positions opposite the gap in the metal ring 40 and would not detect the metal ring 40, even if it is attached.

Figure 4B:
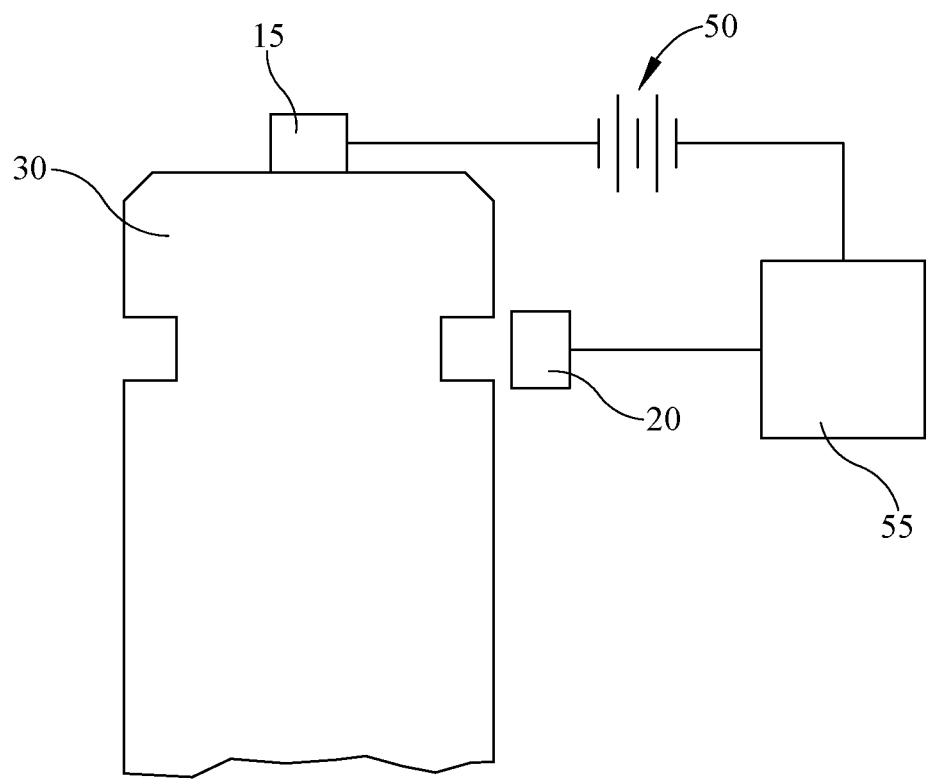
FIG. 4B is the electric circuit without the metal ring on the electrically conductive shaft such that the circuit is not completed.

However, in instances where the metal ring 40 is not present, the circuit of FIG. 4A cannot be completed because, although electrical contact 15 is in contact with the shaft, the side magnet 20 is not and cannot be because those magnets are positioned in a magnet recess 10. Thus, indicator 55 does not identify a complete circuit and may trigger one or more alerts to an operator indicating that the metal ring 40 is missing. For example, as illustrated in FIG. 4B, metal ring 40 is not present and indicator 55 may provide audio or visual feedback to an operator.

In some embodiments, the circuit may identify other imperfections in the shaft and/or metal ring. For example, the side magnets 20 may be positioned such that the circuit is completed only when the metal ring is of a proper size or attached to the conductive shaft with a proper degree of mobility (i.e., properly "loose"). In some embodiments, the circuit may identify whether the metal is the proper size. For example, the side magnets 20 may be partially mobile within the recess and may only complete the circuit if the magnets come in contact with the metal ring while in a particular position. In some embodiments, the circuit may identify whether the conductive shaft has been manufactured correctly (e.g., whether the recess is the proper size and/or in the proper location on the shaft).

In some embodiments, indicator 55 may provide a signal that the circuit is complete or incomplete. For example, indicator 55 may trigger a light when the circuit is incomplete and turn off the light when the circuit is complete (or vice versa). In some embodiments, the electric circuit may identify that the shaft 30 has been inserted into the body 1 and trigger a locking mechanism that locks the shaft 30 into place. The shaft 30 may remain locked into place until the electric circuit determines whether the metal clip 40 is attached. If the metal clip 40 is detected, the electric circuit may release the locking mechanism. If the electric circuit instead determines that the metal clip 40 is not attached, a warning audio and/or visual signal may be generated. Further, an operator may then be required to manually release the locking mechanism, thus insuring that the metal shaft 30 without a metal clip 40 is not allowed to pass an inspection. The operator may then subsequently remove the defective metal shaft 30 from production or cure the defect by adding a metal ring 40.

In various embodiments, indicator 55 may come in various forms. In some implementations, indicator 55 may include an output device such as one or more lights (e.g., light-emitting diodes, or "LEDs'), one or more audio output components (e.g., that can beep), haptic feedback components, e.g., to cause body 1 to vibrate when a metal ring 40 is detected (or not detected). In some embodiments, indicator 55 may include logic such as a field-programmable gate array ("FPGA"), an application-specific integrated circuit ("ASIC"), or one or more microprocessors. In some such implementations, indicator 55 may include a wired or wireless network communication interface (e.g., Wi-Fi, Bluetooth, etc.) that is adapted to provide a wired or wireless signal to a remote computing device (e.g., the user's phone, a remote desktop computer, a server, etc.). That wired or wireless signal may cause the remote computing device to provide audio/visual/haptic feedback and/or may, in some cases, cause a quality control database to be updated to indicate a status of a part currently being examined. In some embodiments, indicator 55 and/or logic associated therewith may keep track of a number and/or locations of failed and successful detections of metal rings, e.g., to be output as a batch.

In alternative embodiments, multiple magnets in the recess 10 may be utilized to test for different configurations of the metal ring 40 and shaft 30. For example, one of side magnets 20 may be an electromagnetic magnet and turned on to test whether or not the metal ring is too large (e.g., by setting the magnet at a location that a properly sized ring would not come into contact and indicating a "pass" if the circuit is not completed). Next, the first magnet may be shut off and a second electromagnet of the side magnets 20 may be turned on the determine whether the metal ring 40 is too small or not present (e.g., the side magnet positioned such that a properly sized metal ring 40 would come into contact with the second side magnet).

In some embodiments, the apparatus described herein may be operated manually by an operator. For example, an operator may manually insert the shaft 30 into the body 1, activate the device, and determine whether the metal ring 40 is attached based on the output of the apparatus. In some embodiments, the apparatus may be part of an automated system, whereby the shaft 30 is inserted into the body 1 and the output signal from the indicator 55 may inform the automated system whether the ring 40 is present. Thus, the apparatus may allow for operation of quality control to be efficiently executed without human input, which may result in less error.

Although embodiments described herein have related to detecting metal rings on various shaft-like components, this is not meant to be limiting. In various embodiments, techniques described may be used for other similar purposes. For example, in some embodiments, devices and apparatus configured with selected aspects of the present disclosure may be used, for instance, to detect presence/absence various types of clips, such as C-clips, retaining rings, etc., and/or may be used to measure sizes and/or types of such clips.

Figure 5:
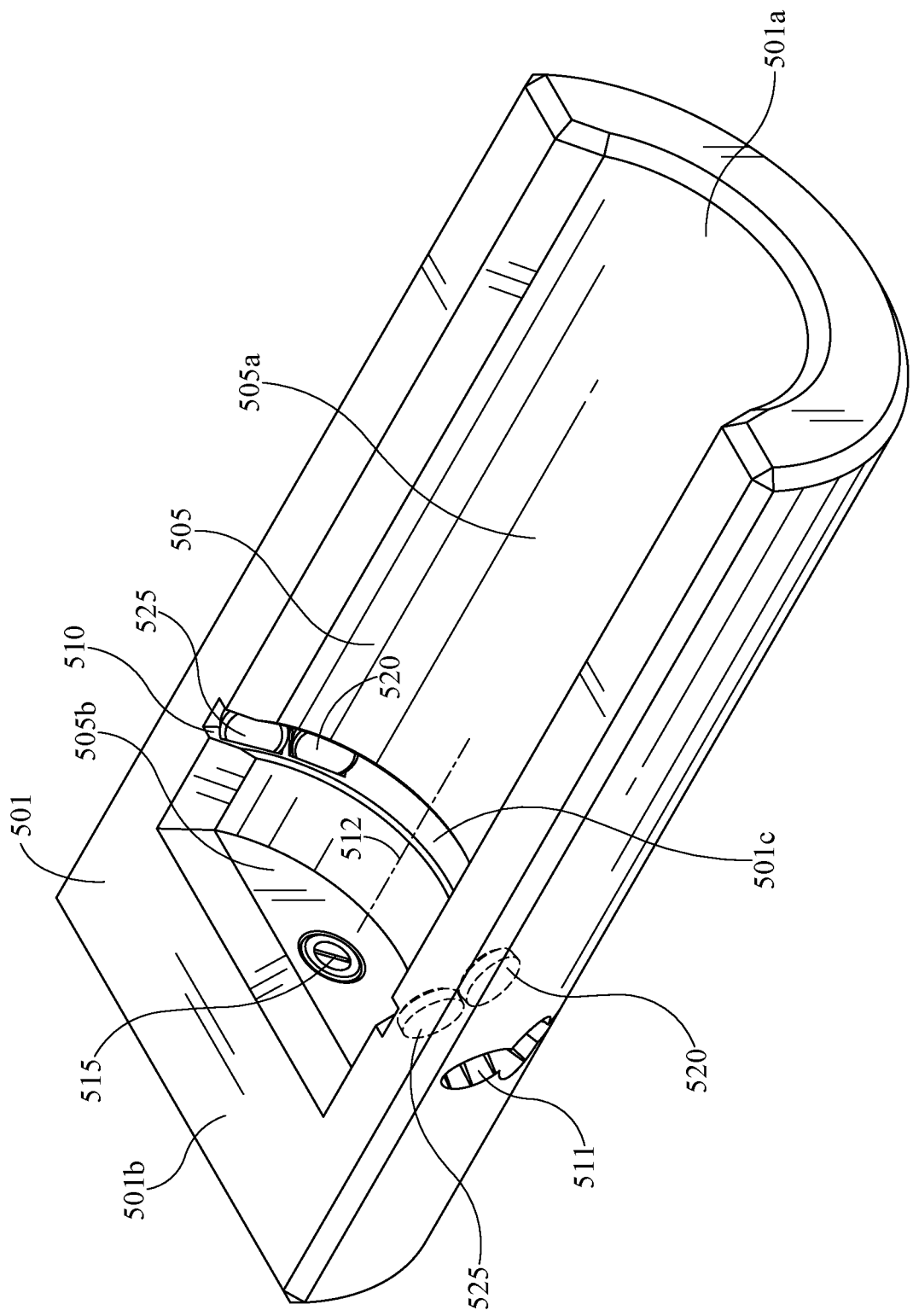
FIG. 5 is a perspective view of another embodiment of the present disclosure.

Referring now to FIG. 5, a perspective view of another embodiment of the apparatus of the present disclosure is provided. Similar to the embodiment illustrated with respect to FIGS. 1-3, the body 501 includes an open end 501a and a closed end 501b opposite the open end 501a and defines a partially cylindrical inner cavity 505; where in the inner cavity 505 is defined by an inner side surface 505a and an inner end surface 505b at the closed end 501b of the body 501. Also similar to the embodiment illustrated with respect to FIGS. 1-3, the apparatus includes an electrical contact 515 provided on the inner end surface 505b of the inner cavity 505. This electrical contact 515 is positioned so that an outward-facing surface of electrical contact 515 is substantially flush with the inner end surface 505b. A magnet recess 510 is also provided on the inner side surface 505a, and is positioned circumferentially around the cylindrical inner cavity 505 and parallel to the inner end surface 505b.

One or more sets of side magnets 520, 525 are positioned in the magnet recess 10. In FIG. 5 each set of side magnets 520, 525 includes two magnets, but this is not meant to be limiting, and each set can have as few as a single magnet, or more than two magnets. As illustrated, each of the sets of magnets 520, 525 are positioned in openings 511 in the body 501 of the apparatus, but this is not required.

As illustrated in FIG. 5, each set of side magnets 520, 525 is positioned within the magnet recess 510 at differing radial distances. The first set of side magnets 520 may be at a first radial distance from a center point 512 of the inner cavity 505, while the second set of side magnets 525 may be at a second radial distance from the center point 512 of the inner cavity 505. For example, in some embodiments, the angle subtended by the arc between the first set of magnets 520 may be about 160 degrees, while the angle generated by the arc between the second set of magnets 525 may be about 180 degrees. Other angles are contemplated. For example, the first set of magnets 520 and the second set of magnets 525 may be about 180 degrees from each other, e.g., at opposite sides of inner cavity 505. In some embodiments, the first and the second sets of side magnets 520, 525 may be positioned such that the inner surfaces (i.e., the surface of each of the magnets 520, 525 that is exposed to the inner cavity 505) are inset from (or recessed from) the side inner surface 505a. As illustrated, the magnets 520, 525 protrude from the magnet recess inner surface 501c, but not so far as to protrude into the inner cavity 505 farther than the inner side surface 505a.

Although illustrated as a first and a second set of magnets 520, 525, this is not to be understood as limiting. In some embodiments, there may be only a single first magnet 520 and a single second magnet 525 rather than a set of magnets. In such embodiments, the first magnet 520 and the second magnet 525 may be different radial distances from a center point 512 of the inner cavity 505.

The electrical contact 515 and the sets of magnets 520, 525 may be connected to one or more electrical circuits. For example, wiring to the one or more electrical circuits may connect to the first and the second side magnets 520, 525 via openings 511 in the body 501. In some embodiments, the magnets may be electromagnetic elements, which may become magnetized when a current is supplied to the magnets. In other embodiments, electrical contact 515 and/or first or second side magnets 520, 525 may be permanent magnets. For illustrative purposes, it can be assumed that there are separate first and second electrical circuits that are not depicted in FIG. 5; however, this is not intended to be limiting, as other circuit configurations may be used.

A conductive shaft 30, such as illustrated in and described with reference to FIGS. 2 and 3, may be inserted into the body 501. As described herein, a metal ring 40 is secured to the shaft 30 at the shaft recess 35. Once the conductive shaft 30 is inserted into the body 501, the first and/or second sets of side magnets 520, 525 may be in contact with the metal ring 40. Because both the metal ring 40 and the shaft 30 are electrically conductive, a current applied to the electrical contact 515 as one terminal and the magnets 520, 525 as a second terminal passes through the shaft 30 and metal ring 40, where contact is made between the shaft (along the interior surface of the metal ring 40 for at least some portion) and the magnets 520, 525. In some instances, such as described herein, the one or more electrical circuits are nominally open, and this simultaneous contact closes the electrical circuit. The use of a first and a second set of side magnets 520, 525 allows for a determination of whether the metal ring 40 meets or exceeds minimum and maximum size standards.

A current may be applied to apparatus via electrical contact 515 for the one or more electrical circuits. A first signal, indicating that the metal ring 40 meets a minimum size requirement, may be generated by one or more of the electrical circuits if the metal ring 40 is detected through simultaneous contact between: the metal ring 40 and the one or more first side magnets 520, as well as between the conductive shaft 30 and the electrical contact 515. A second signal, indicating that the metal ring exceeds a maximum size requirement, may be generated by one or more of the electrical circuits if the metal ring 40 is detected through simultaneous contact between the metal ring 40 the one or more second side magnets 525, and the conductive shaft 30 and the electrical contact 515. In some instances, the one or more electrical circuits may provide another signal (e.g. a fails to meet minimum size signal) if the metal ring is not detected by either the first or second set of side magnets 520, 525. Similar to the embodiment described with reference to FIGS. 1-3, any of the signals described herein may be a light signal, a speaker signal, a vibration signal, a signal provided to one or more remote computing devices, or a combination thereof.

Figure 6A:
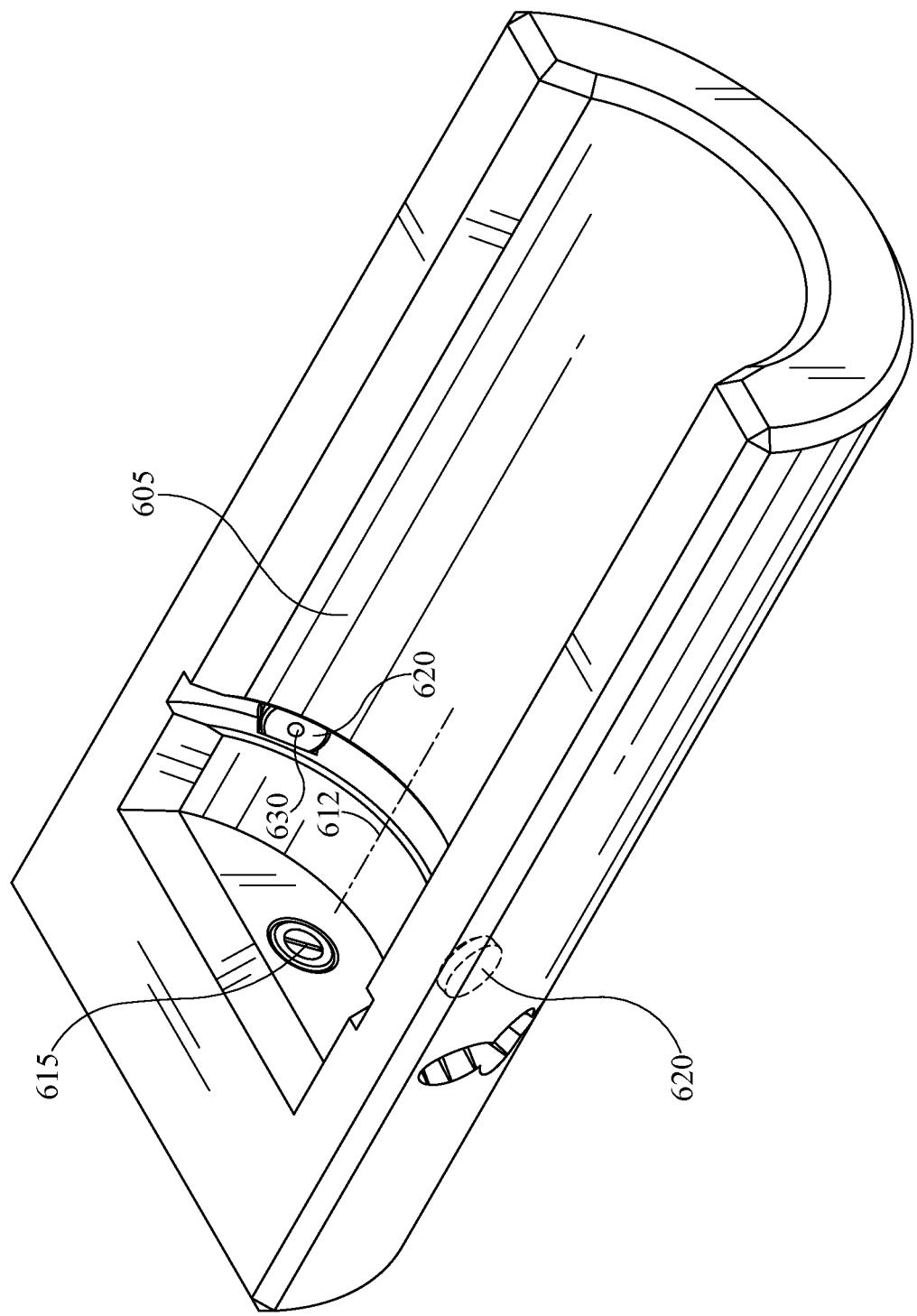
FIG. 6A is a perspective view of another embodiment of the present disclosure including a plurality of rods in a retracted position.
Figure 6B:
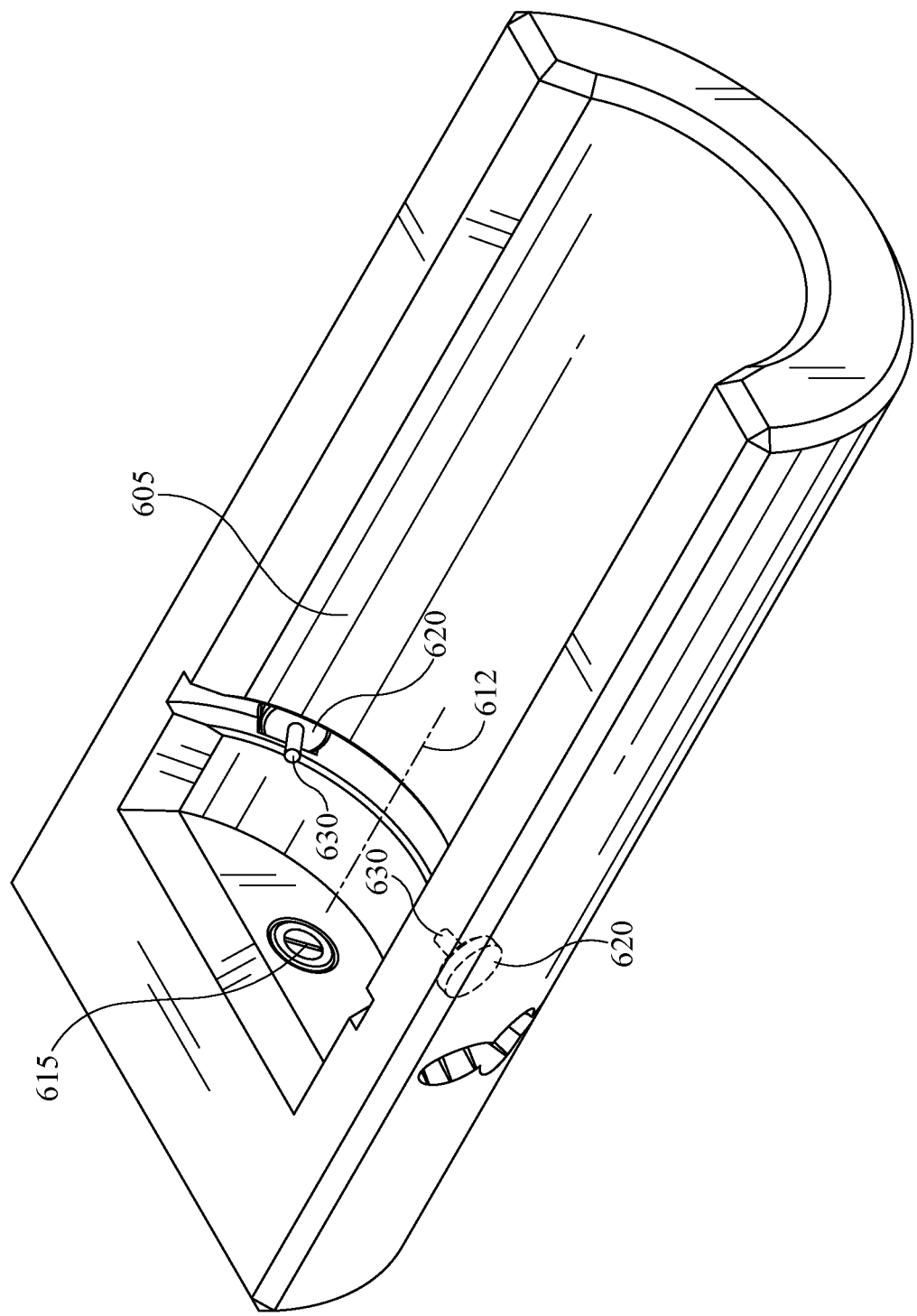
FIG. 6B is a perspective view of another embodiment of the present disclosure including a plurality of rods in an extended position.

In another embodiment, such as illustrated in FIGS. 6A-B, one or more side magnets 620 may include a conductive rod 630 configured to be moved from a first, retracted position (FIG. 6A) to a second, extended position (FIG. 6B). In some instances, this movement may be effectuated by a spring-mechanism; while in other instances, this movement may be effectuated electromagnetically. The mechanism of the movement of the conductive rods 630 is not limited and may be achieved by any means known in the art. When the conductive rods 630 are in the retracted position (see FIG. 6A), the conductive rods 630 may be substantially flush with, or even retracted into, the one or more side magnets 620. When the conductive rods 630 are in the extended position (see FIG. 6B), the conductive rods 630 extend into the inner cavity 605 of the apparatus. While the conductive rods 630 are movable between different radial distances from the center point 612 of inner cavity 605, the side magnet(s) 620 may, in some cases, be a fixed radial distance from the center point 612 of the inner cavity 605.

Although illustrated with two magnets 620, one on each side of the center point 612 of the inner cavity 605, it is to be understood that this is not limiting. In some instances, there may only be a single magnet 620 with a conductive rod 630. In other instances, where there may be multiple magnets, those magnets may or may not be radially equidistant from the center point 612 of the inner cavity 605. Furthermore, where multiple magnets 620 are present, each magnet 620 may or may not have a conductive rod 630.

The use of movable or repositionable conductive rods 630 may allow for testing the quality of the fit of the metal ring 40. As a non-limiting example, when the conductive rods 630 are in the extended position depicted in FIG. 6B and there is simultaneous contact between the metal ring 40 and the conductive rods 630 in the extended position, and between the conductive shaft 30 and an electrical contact 615, a first signal may be provided by one or more electrical circuits. This first signal may be indicative that the metal ring 40 meets a minimum size requirement and/or is properly fit at the shaft recess 35.

Where the conductive rods 630 are in the retracted position (FIG. 6A) and there is simultaneous contact between the metal ring 40 and the magnet(s) 620 (or the retracted conductive rods 630), as well as contact between the conductive shaft 30 and the electrical contact 615, a second signal may be provided by one or more of the electrical circuits. This second signal may be indicative that the metal ring 40 may be improperly fit or attached to the conductive shaft; for example, the metal ring 40 may be too loose and as a result, the conductive rods 630 and/or side magnet(s) 620 may be able to pull the metal ring 40 out of the shaft recess 35 in order to make contact with the side magnet(s) 620 and/or the conductive rods 630 in a retracted position (FIG. 6A).

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

The invention claimed is:

1. An apparatus for testing an assembly of an at least partially electrically conductive shaft and a metal ring secured to a shaft recess of the conductive shaft, comprising:
   a body having an open end and an at least partially cylindrical inner cavity defined by an inner surface having an inner side surface and an inner end surface opposite the open end, wherein the inner cavity is to receive the at least partially electrically conductive shaft;
   an electrical contact positioned on the inner surface to contact the conductive shaft when the conductive shaft is inserted into the inner cavity;
   at least one magnet disposed in a magnet recess in the inner side surface of the body;
   wherein the at least one magnet further includes a first conductive region and a second conductive region;
   wherein the first conductive region is a fixed, first radial distance from a center point of the inner cavity and the second conductive region is a second radial distance from the center point of the inner cavity;
   wherein the shaft recess of the conductive shaft aligns with the magnet recess in the inner side surface when the conductive shaft is inserted into the inner cavity; and
   an electric circuit that detects whether the metal ring is secured around the conductive shaft at the shaft recess of the conductive shaft in response to simultaneous contact between: the metal ring and the at least one magnet; and the conductive shaft and the electrical contact.

2. The apparatus of claim 1, wherein the first conductive region is a first side magnet and the second conductive region is a second side magnet.

3. The apparatus of claim 2, wherein the electric circuit further provides a first signal if the metal ring is detected through simultaneous contact between:
   the metal ring and the first side magnet, and
   the conductive shaft and the electrical contact;
   wherein the first signal indicates the metal ring meets a minimum size requirement.

4. The apparatus of claim 2, wherein the electric circuit further provides a second signal if the metal ring is detected through simultaneous contact between:
   the metal ring and the second side magnet, and
   the conductive shaft and the electrical contact;
   wherein the second signal indicates the metal ring exceeds a maximum size requirement.

5. The apparatus of claim 1, wherein the first conductive region is a first side magnet and the second conductive region is a conductive movable rod disposed in the first side magnet and is configured to move between a retracted position and an extended position,
   wherein in the retracted position the conductive movable rod is substantially flush with or retracted into the first side magnet; and
   wherein in the extended position the conductive movable rod extends from the first side magnet.

6. The apparatus of claim 5, wherein the electric circuit further provides a first signal if the metal ring is detected through simultaneous contact between:

the metal ring and the conductive movable rod in the extended position, and the conductive shaft and the electrical contact;

wherein the first signal indicates the metal ring meets a minimum size requirement.

7. The apparatus of claim 5, the electric circuit further provides a second signal if the metal ring is detected through simultaneous contact between:

the metal ring and the conductive movable rod in the retracted position, and the conductive shaft and the electrical contact;

wherein the second signal indicates the metal ring is improperly attached to the conductive shaft.

8. The apparatus of claim 1, wherein the electric circuit further provides a signal if the metal ring is not detected.

9. An apparatus for testing an assembly of an at least partially electrically conductive shaft and a metal ring secured to a shaft recess of the conductive shaft, comprising:

a body having an open end and an at least partially cylindrical inner cavity defined by an inner surface having an inner side surface and an inner end surface opposite the open end, wherein the inner cavity is to receive the at least partially electrically conductive shaft;

an electrical contact positioned on the inner surface to contact the conductive shaft when the conductive shaft is inserted into the inner cavity;

one or more first side magnets and one or more second side magnets, each of which are disposed in a magnet recess in the inner side surface of the body;

wherein the one or more first side magnets are disposed in the magnet recess at a first radial distance from a center point of the inner cavity and the one or more second side magnets are disposed in the magnet recess at a second radial distance from the center point of the inner cavity;

wherein the shaft recess of the conductive shaft aligns with the magnet recess in the inner side surface when the conductive shaft is inserted into the inner cavity; and an electric circuit that detects whether the metal ring is secured around the conductive shaft at the shaft recess of the conductive shaft in response to simultaneous contact between:

the metal ring and the one or more first side magnets or the one or more second side magnets; and the conductive shaft and the electrical contact.

10. The apparatus of claim 9, wherein the electric circuit further provides a first signal if the metal ring is detected through simultaneous contact between the metal ring and the one or more first side magnets and the conductive shaft and the electrical contact, wherein the first signal indicates the metal ring meets a minimum size requirement.

11. The apparatus of claim 9, wherein the electric circuit further provides a second signal if the metal ring is detected through simultaneous contact between the metal ring and the one or more second side magnets, and the conductive shaft and the electrical contact, wherein the second signal indicates the metal ring exceeds a maximum size requirement.

12. The apparatus of claim 9, wherein the electric circuit further provides a signal if the metal ring is not detected.

13. The apparatus of claim 9, wherein the electric circuit is nominally open, and the simultaneous contact closes the electric circuit.

14. An apparatus for testing an assembly of an at least partially electrically conductive shaft and a metal ring secured to a shaft recess of the conductive shaft, comprising:

a body having an open end and an at least partially cylindrical inner cavity defined by an inner surface having an inner side surface and an inner end surface opposite the open end, wherein the at least partially electrically conductive shaft is receivable by the inner cavity;

an electrical contact positioned on the inner surface such that the conductive shaft is in contact with the electrical contact when the conductive shaft is inserted into the inner cavity;

at least one magnet disposed in a magnet recess in the inner side surface of the body, wherein the at least one magnet includes a conductive movable rod;

wherein in a retracted position the conductive movable rod is substantially flush with or retracted into the at least one magnet; and wherein in an extended position the conductive movable rod extends into the inner cavity;

an electric circuit that detects whether the metal ring is secured around the conductive shaft at the shaft recess of the conductive shaft in response to simultaneous contact between:

the metal ring and at least portion of the at least one magnet; and the conductive shaft and the electrical contact.

15. The apparatus of claim 14, wherein the electric circuit provides a first signal if the metal ring is detected through simultaneous contact between the metal ring and the conductive movable rod in the extended position and the conductive shaft and the electrical contact, wherein the first signal indicates the metal ring meets a minimum size requirement.

16. The apparatus of claim 14, wherein the electric circuit further provides a second signal if the metal ring is detected through simultaneous contact between the metal ring and the conductive movable rod in the retracted position and the conductive shaft and the electrical contact, wherein the second signal is indicative the metal ring is improperly attached to the conductive shaft.

17. The apparatus of claim 14, wherein the electric circuit further provides a signal if the metal ring is not detected.

18. The apparatus of claim 14, wherein the electric circuit is nominally open, and the simultaneous contact closes the electric circuit.

* * * * *